United States Patent
Tseng et al.

(10) Patent No.: US 11,315,815 B2
(45) Date of Patent: Apr. 26, 2022

(54) WAFER CONTAINER AND METHOD FOR HOLDING WAFER

(71) Applicant: TAIWAN SEMICONDUCTOR MANUFACTURING CO., LTD., Hsinchu (TW)

(72) Inventors: Po-Hsun Tseng, New Taipei (TW); Yan-Hong Liu, Hsinchu County (TW); Wen-Han Tan, Hsinchu (TW); Hung-Wen Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 565 days.

(21) Appl. No.: 14/988,504

(22) Filed: Jan. 5, 2016

(65) Prior Publication Data
US 2017/0194180 A1 Jul. 6, 2017

(51) Int. Cl.
*H01L 21/673* (2006.01)
*H01L 21/322* (2006.01)

(52) U.S. Cl.
CPC ...... *H01L 21/67389* (2013.01); *H01L 21/322* (2013.01); *H01L 21/6732* (2013.01); *H01L 21/67383* (2013.01); *H01L 21/67393* (2013.01)

(58) Field of Classification Search
CPC ............. H01L 21/67389; H01L 21/322; H01L 21/6732; H01L 21/67383; H01L 21/67393
USPC ................. 206/710–712, 454–455, 832–833
See application file for complete search history.

(56) References Cited

U.S. PATENT DOCUMENTS

| | | | | | |
|---|---|---|---|---|---|
| 4,600,231 | A | * | 7/1986 | Sickles | H05K 13/0069 206/707 |
| 4,658,960 | A | * | 4/1987 | Iwasa | H01L 21/67294 118/500 |
| 5,707,124 | A | * | 1/1998 | Johnson | A47B 81/068 206/308.1 |
| 5,819,927 | A | * | 10/1998 | Yeh | G11B 33/0438 206/308.1 |
| 7,334,691 | B2 | * | 2/2008 | Liu | H01L 21/6734 211/41.18 |
| 8,657,125 | B2 | * | 2/2014 | Hsieh | A47G 29/00 206/707 |
| 9,562,816 | B2 | * | 2/2017 | Ji | H05K 7/1408 |
| 2004/0069680 | A1 | * | 4/2004 | Song | H01L 21/6734 206/711 |
| 2004/0108284 | A1 | * | 6/2004 | Huang | H01L 21/6734 211/41.18 |
| 2004/0170003 | A1 | * | 9/2004 | Chen | H01L 21/67363 361/741 |
| 2009/0250374 | A1 | * | 10/2009 | Kasama | H01L 21/67309 206/711 |
| 2011/0259840 | A1 | * | 10/2011 | Park | H01L 21/6732 211/41.18 |
| 2013/0341239 | A1 | * | 12/2013 | Inoue | H01L 23/02 206/711 |
| 2015/0214084 | A1 | * | 7/2015 | Schneider | H01L 21/67161 206/711 |

(Continued)

*Primary Examiner* — Robert Poon
(74) *Attorney, Agent, or Firm* — Maschoff Brennan

(57) ABSTRACT

A wafer container includes at least one shelf and a frame. The shelf is capable of holding at least one wafer, and has at least one opening therein. The opening is at least partially exposed by the wafer when the wafer is hold by the shelf. The frame carries the shelf and allows access to the shelf.

20 Claims, 7 Drawing Sheets

(56) References Cited

U.S. PATENT DOCUMENTS

2016/0263591 A1* 9/2016 Woo ................ B05B 1/005
2016/0284580 A1* 9/2016 Woo ................ H01L 21/67393

\* cited by examiner

WAFER CONTAINER AND METHOD FOR HOLDING WAFER

BACKGROUND

The present disclosure relates to wafer containers.

Semiconductor integrated circuit fabrication facilities ("fabs") are automated. Movement of semiconductor wafers between various process tools is accomplished by an automated material handling system (AMHS). The wafers are transported through the fab in front opening unified pods (FOUPs), wafer holding devices capable of holding wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
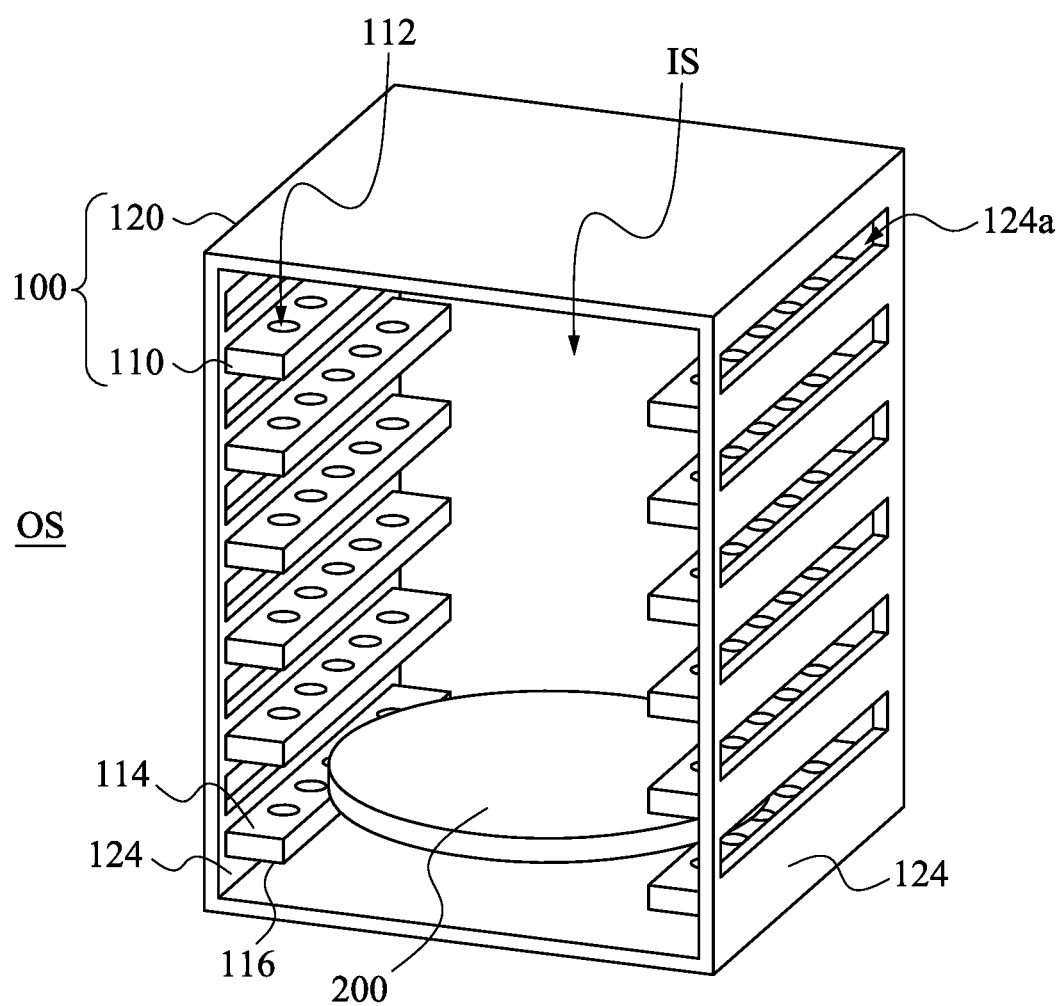
FIG. 1A is a schematic view of a wafer container according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic view of a wafer container 100 according to some embodiments of the present disclosure. The wafer container 100 includes at least one shelf 110 and a frame 120. The shelf 110 is capable of holding at least one wafer 200 and has at least one opening 112 therein. The opening 112 is at least partially exposed by the wafer 200 when the wafer 200 is hold by the shelf 110. The frame 120 carries the shelf 110 and allows access to the shelf 110, in which the opening 112 of the shelf 110 fluidly communicates with an inner space IS of the frame 120.

In some embodiments of the present disclosure, the frame 120 may have at least one sidewall 124 carrying the shelf 110 and allowing access to the shelf 110. In some embodiments, the sidewall 124 of the frame 120 has at least one opening 124a therein. In some embodiments of the present disclosure, the frame 120 has the inner space IS therein, and there is an outer space OS out of the frame 120. The openings 124a of the sidewalls 124 may connects the inner space IS and the outer space OS, such that gas exchanges rapidly through the openings 124a of the sidewalls 124.

In some embodiments of the present disclosure, the frame 120 has at least a pair of sidewalls 124 opposite each other, and at least a pair of the shelves 110 are respectively present on the sidewalls 124 of the frame 120. That is, the pair of the shelves 110 are respectively stationary with respect to the sidewalls 124 of the frame 120. The pair of the shelves 110 may be substantially horizontally aligned. In some embodiments of the present disclosure, there may be plural pairs of the shelves 110 respectively present on the sidewalls 124 of the frame 120. The pairs of the shelves 110 are respectively stationary with respect to the sidewalls 124 of the frame 120 and vertically spaced apart to define at least one slot for the wafer 200. Through the configuration of the pair(s) of the shelves 110, the shelves 110 support the edges of the wafer(s) 200, and the wafer(s) 200 may be temporarily stored in the wafer container 100.

In some embodiments of the present disclosure, one of the shelves 110 may have plural openings 112 therein. The openings 112 may be considered as through holes. The openings 112 may extend through the shelves 110 and connect the upper surfaces 114 of the shelves 110 and the lower surfaces 116 of the shelves 110, such that gas above the shelves 110 and gas under the shelves 110 may be fluidly communicated with each other through the openings 112.

Figure 1B:
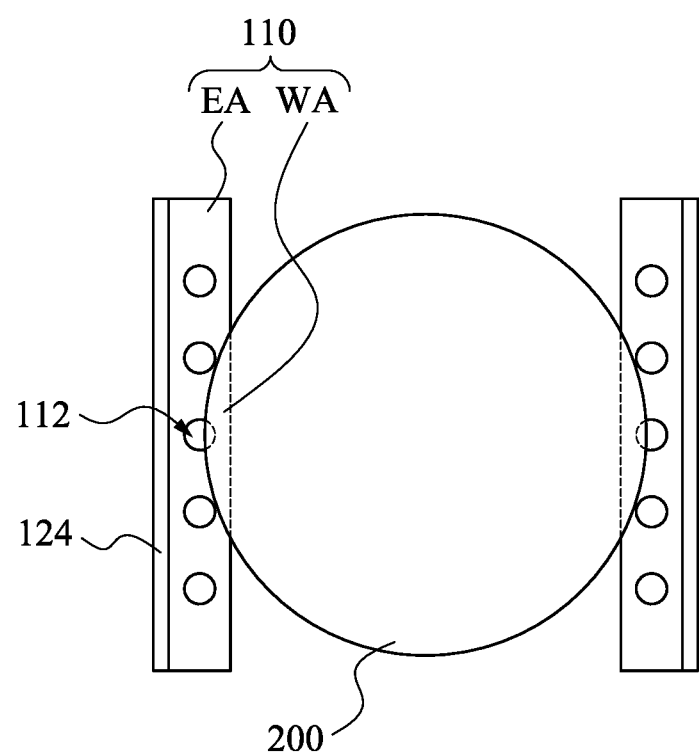
FIG. 1B is a top view of a pair of shelves of the wafer container of FIG. 1A.

FIG. 1B is a top view of the pair of the shelves 110 of the wafer container 100 of FIG. 1A. For better illustration, the wafer 200 is also depicted in the FIG. 1B. Reference is made to both FIG. 1A and FIG. 1B. In some embodiments of the present disclosure, it is defined that each of the shelves 110 has a wafer-area WA and an edge area EA. The wafer-area WA is the region where the wafer 200 is to be disposed, and the edge area EA surrounds the wafer-area WA. In other words, when the wafer 200 is disposed on the shelves 110, a projection of the wafer 200 on the shelves 110 overlaps the wafer-area WA of the shelves 110, and the projection of the wafer 200 on the shelves 110 does not overlap the edge area EA of the shelves 110.

Herein, some of the openings 112 are present in the edge area EA, and some of the openings 112 are both present in the wafer-area WA and the edge area EA. In some embodiments of the present disclosure, the openings 112 are at least partially present in the edge area EA. In this way, when the wafer 200 is hold by the shelves 110, at least a portion of the openings 112 is not covered by the wafer 200, and thereto the openings 112 keep the vertical fluid communication (such as convection) among the spaces divided by the shelves 110 in the frame 120.

Though the openings 112 are depicted as having circular cross sections respectively in the figures, it should not limit various embodiments of the present disclosure. In some embodiments of the present disclosure, the openings 112 may have cross sections of a rectangle, a triangle, a square, other polygons, or combinations thereof.

Figure 1C:
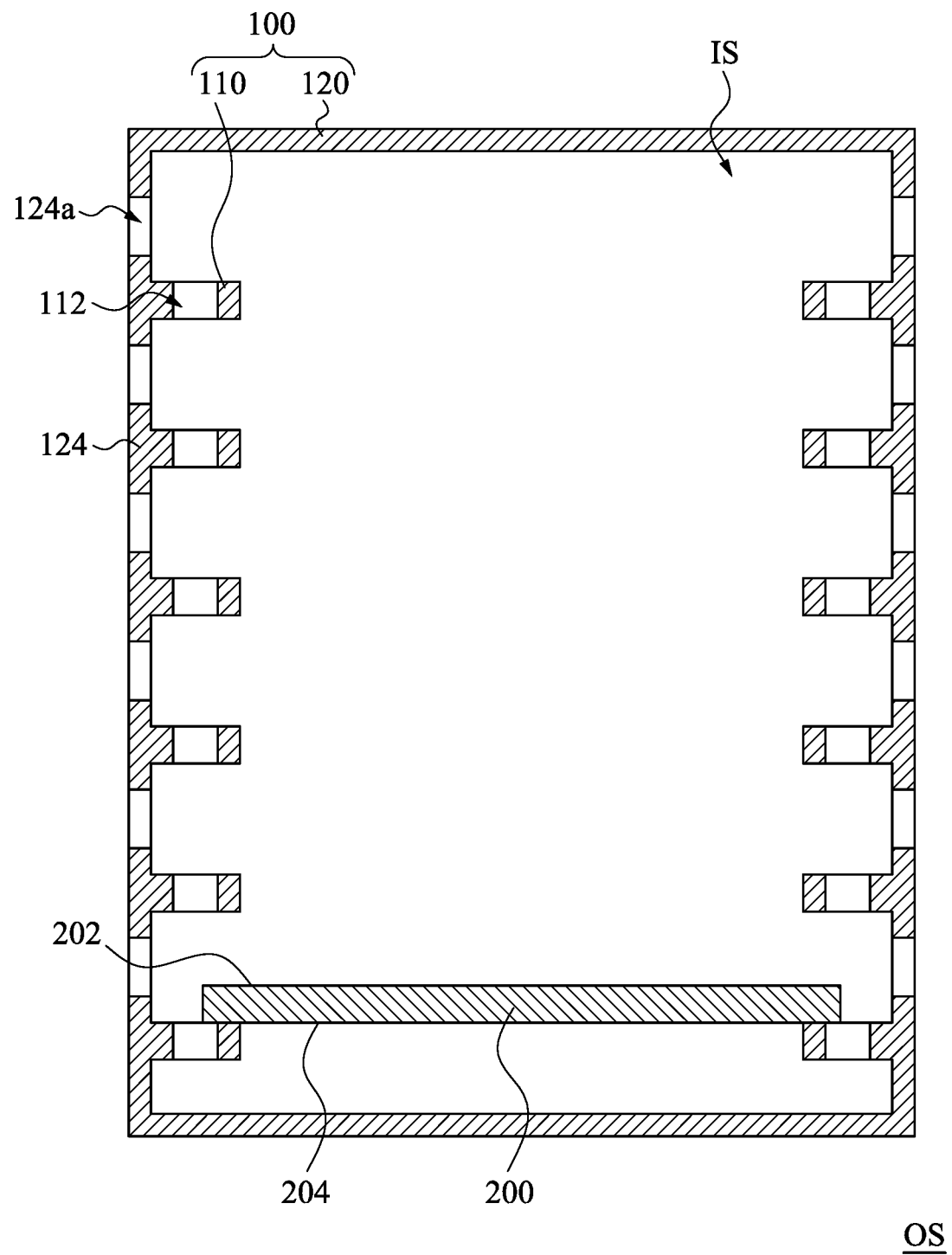
FIG. 1C is a cross-sectional view of the wafer container of FIG. 1A.

FIG. 1C is a cross-sectional view of the wafer container 100 of FIG. 1A. Reference is made to both FIG. 1A and FIG. 1C. In some embodiments of the present disclosure, the openings 124a of the sidewalls 124 are configured to be interlaced with the shelves 110. To be specific, the horizontal projections of the shelves 110 on one of the sidewalls 124 are interlaced with the openings 124a of the one of the sidewall 124. And, the openings 124a of the sidewalls 124 may have elongated shapes along with the shelves 112. For example, the openings 124a of the sidewalls 124 may have a rectangular cross section or an oval cross section. Through the configuration of the openings 124a of the sidewalls 124, each of the shelves 110 is immersed in a space where gas exchanges rapidly. Therefore, the openings 112 of the shelves 110 further fluidly communicates with the outer space OS of the frame 120 through the openings 124a of the sidewalls 124. In this way, when the wafer 200 is placed on the shelves 110, the gas near the edges of the wafer 200 may exchange rapidly with the gas in the inner space IS or the gas in the outer space OS through the openings 124a and the openings 112.

In some embodiments, the wafer carrier 100 may include the sidewalls 124 having openings 124a and the shelves 110 without the openings 112, and the gas near the shelves 110 may still flow horizontally through the opening 124a of the sidewall 124. Furthermore, in some embodiments, the wafer carrier 100 may include the shelves 110 having the openings 112 and the sidewalls 124 without openings 124a, and the gas near the shelves 110 may still flow vertically through the openings 112.

In some embodiments of the present disclosure, the shelves 110 and the frame 120 are made of, for example, plastic. In one or more embodiments, the shelves 110 and the frame 120 may be made of the same or different materials.

Figure 2:
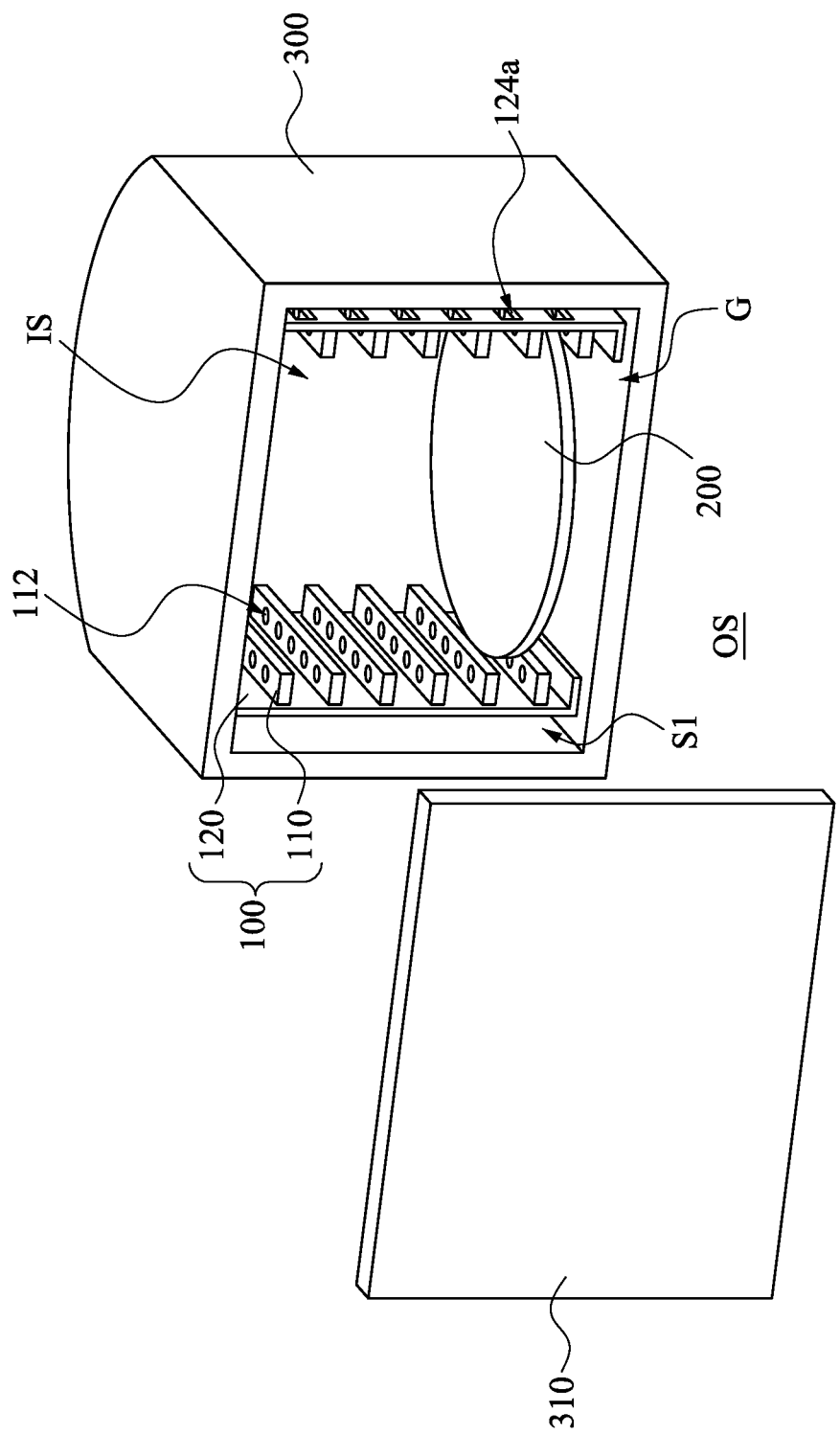
FIG. 2 is a schematic view of the wafer container of FIG. 1A fitted into a box according to some embodiments of the present disclosure.

Reference is made of FIG. 1A and FIG. 2. FIG. 2 is a schematic view of the wafer container 100 of FIG. 1A fitted into a box 300 according to some embodiments of the present disclosure. The box 300 may be utilized for shipping the wafer 200. There may be some features (not shown) in the box 300 for fixing the wafer container 100 or moving the wafer container 100, such as slides.

In the present embodiments, the outer space OS may indicate the space out of the box 300. In some embodiments of the present disclosure, there is a space S1 between the box 300 and the wafer container 100, and the space Si fluid communicates with the inner space IS through the opening 124a.

In some embodiments of the present disclosure, the box 300 may not be fully sealed since the door 310 of the box 300 leaves an air gap G at the edge of the door 310 when the door 310 is closed. As a result, in some embodiments, the space S1 may fluid communicates with the outer space OS through the gap. In this way, through the opening 124a, the inner space IS may fluid communicates with the outer space OS.

Figure 3:
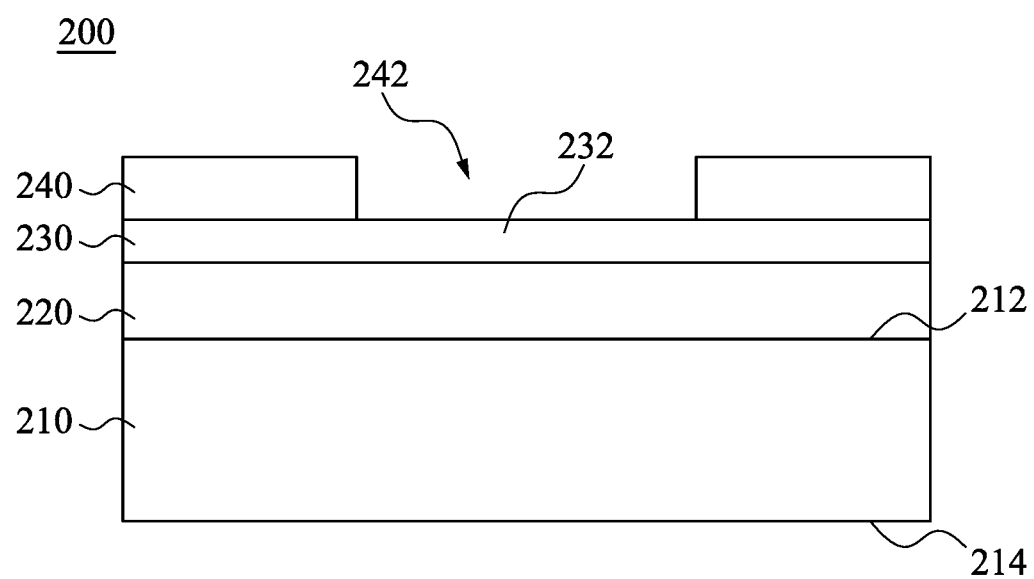
FIG. 3 is a cross-sectional view of a wafer according to some embodiments of the present disclosure.

FIG. 3 is a cross-sectional view of a wafer 200 according to some embodiments of the present disclosure. In these embodiments, the wafer 200 includes a substrate 210, an insulator layer 220, a metal layer 230, and a passivation layer 240. It is noted that the configuration of the wafer 200 shown in FIG. 3 should not limit various embodiments of the present disclosure. In some embodiments, instead of those shown in the figure, the wafer 200 may include various features or devices depending on design requirements as known in the art.

In some embodiments of the present disclosure, the substrate 210 is made of a semiconductor material, such as silicon, germanium, silicon-germanium, or combinations thereof. Alternatively, the substrate 210 may be, for example, bulk silicon or an active layer of a silicon on insulator (SOI) substrate. Other substrates that may be used include multi-layered substrates, gradient substrates, or hybrid orientation substrates.

The insulator layer 220 is formed overlying the substrate 210. Depositing a material layer utilizing techniques such as thermal oxidation, chemical vapor deposition (CVD), atomic layer deposition (ALD), or any other appropriate method, may also form the insulator layer 220.

The metal layer 230 is formed overlying the insulator layer 220. For example, the material of the metal layer 210 may be aluminum-copper. The metal layer 220 may be formed by chemical vapor deposition (CVD), physical vapor deposition (PVD), atomic layer deposition (ALD), other suitable techniques, or a combination thereof. In some examples, the metal layer 230 is patterned to form a bonding pad 232 for circuits. The patterning process further includes lithography and etching. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

The passivation layer 240 is formed overlying both the insulator layer 220 and the metal layer 230 for isolating a portion of the metal layer 230 from the air. Through the configuration of the passivation layer 240, the metal layer 230 is prevented from being oxided by the water vapor in this air. The passivation layer 240 may be formed by coating or disposition techniques. In some embodiments of the present disclosure, the passivation layer 240 has an opening 242 therein to expose bonding pad 232 of the metal layer 230.

Herein, to form the openings 242, a masking layer (not shown) may be deposited overlying the passivation layer 240. For example, a photoresist layer (not shown) or other mask such as titanium oxide or silicon oxide is coated overlying the passivation layer 240. This deposited photoresist layer (not shown) is exposed to actinic light through a mask and is then developed to remove portions of the photoresist layer (not shown) overlying bonding pad 232 of the metal layer 230. The patterned masking layer (not shown) is then used as a mask for etching the openings 242 in the passivation layer 240.

The etching process for the pad etch includes a fluorine-containing chemistry. For example, carbon tetrafluorides (CF4) or sulfur fluorides (SF6) may be used in the dry pad etch process. In these processes, the fluorine ions exhibit excellent etching properties in terms of selectivity and anisotropic etching. After the pad etch, the wafer 200 is subjected to an ash process to remove the photoresist layer (not shown) on the passivation layer 240. The ash process may be performed, for example, using reactive plasma with a flouroboric acid such as carbon tetrafluorides (CF4). Subsequently, a clean process may be performed for clean the residue of the plasma away by applying acid liquid, such as ACT690, to the wafer 200. In addition, in some embodiments, the wafer may optionally include liners (not shown), and the liners may be patterned or removed, for example, with a plasma, such as carbon tetrafluorides ($CF_4$) or nitrogen trifluorides ($NF_3$). It is noted that the formation steps of the wafer 200 illustrated herein should not limit various embodiments of the present disclosure.

A high concentration of ionic fluorine species is left behind, since the etch and the removal processes are performed with the fluorine-containing plasma or gas. The presence of this fluorine contamination (ionic fluorine species) may cause several problems. To be specific, the metal layer 230 may have a chemical reaction with the fluorine contamination, the fluorine tends to cause corrosions or pad crystal defects.

Herein, the corrosions or pad crystal defects are briefly illustrated with the metal layer 230 made of aluminum or an alloy of aluminum and copper. The aluminum may have plural chemical reactions with the ionic fluorine species, and the chemical reactions may be described as the following formulas:

$$Al+F^-\rightarrow AlF_3;$$

$$AlF_3+H_2O\rightarrow Al(OH)_3+HF; \text{ and}$$

$$Al(OH)_3+H^-+F^-AlO_xF_y+H_2O.$$

To be specific, the metal layer 210 may first react with the fluoride ions ($F^-$) released from the wafer 200 to yield aluminum fluoride ($AlF_3$). Subsequently, the aluminum fluoride ($AlF_3$) may react with water vapor (which may come from the liquid acid) in the air to yield the aluminum hydroxide ($Al(OH)_3$) and hydrogen fluoride (HF). Next, the aluminum hydroxide ($Al(OH)_3$) may react with the hydrogen ions and the fluoride ions and yield aluminum fluoride oxide ($AlOxF_y$) and water vapor ($H_2O$). In this way, the final product of the above chemical reactions is the aluminum fluoride oxide ($AlO_xF_y$), which may be considered as defects for the wafer 200.

Due to problems of the corrosions and pad crystal defects, in some embodiments, after the etch and removal process, an argon (Ar) treatment may be performed to remove the undesired substances (which include fluorine contamination) from the bonding pads 232. Also, a cleaning process with acid liquid such as ACT 690 may be performed to remove the plasma of the argon plasma. The wafer 200 may further be baked for removing the water therein. After the above process, the features or devices are fabricated on the wafer 200. Subsequently, the wafer 200 may be stacked in a wafer container and transported to a separate facility which is remote from the fabrication facility for packaging or other processing.

However, in some circumstances, the Ar treatment is incapable of removing all the fluorine contamination, and a slight amount of the fluorine contamination may accumulate in the wafer 200. With the accumulation of the fluorine contamination, the wafer 200 may outgas fluoride gas (ionic fluorine species) later.

Reference is made to both FIG. 1A and FIG. 3. In the absence of the openings 214a of the sidewalls 214 and the openings 112 of the shelves 110(see FIG. 1A), when the wafer 200 is stored in a box for transferring, it is often observed that defects are formed at the edges of the wafer 200. To be specific, the ionic fluorine species may be released from the wafer 200, and slowly flows in the inner space IS of the frame 120. As a result, the ionic fluorine species may be substantially confined in the space among the shelves 110 and one of the sidewalls 124. In this way, the concentration of ionic fluorine species in the space becomes high, and therefore the defects easily occur at the edges of the wafer 200.

Reference is made to both FIG. 1A and FIG. 3. In the embodiments of the present disclosure, a method for holding the wafer 200 is illustrated herein, in which the wafer carrier 100 of FIG. 1A may hold wafer 200 with little formation of the defects. It is noted that in addition to the following steps described, other steps may also be included in the method.

The wafer 200 is first inserted into the frame 120 carrying the plural shelves 110. Often, for preventing the features (such as the metal layer 230 or the passivation layer 240) formed on the surface 212 of the substrate 210 of the wafer 200 from being scratched, the wafer 200 may be disposed on the shelves 110 such that the surface 212 where the features are formed faces up, and the surface 214 of the substrate 210 of the wafer 200 may face down and be in contact with the upper surface 114 of the shelves 110. As shown in the figure, the wafer 200 disposed on the shelves 110 exposes a portion of the openings 112 of the shelves 110.

Figure 4:
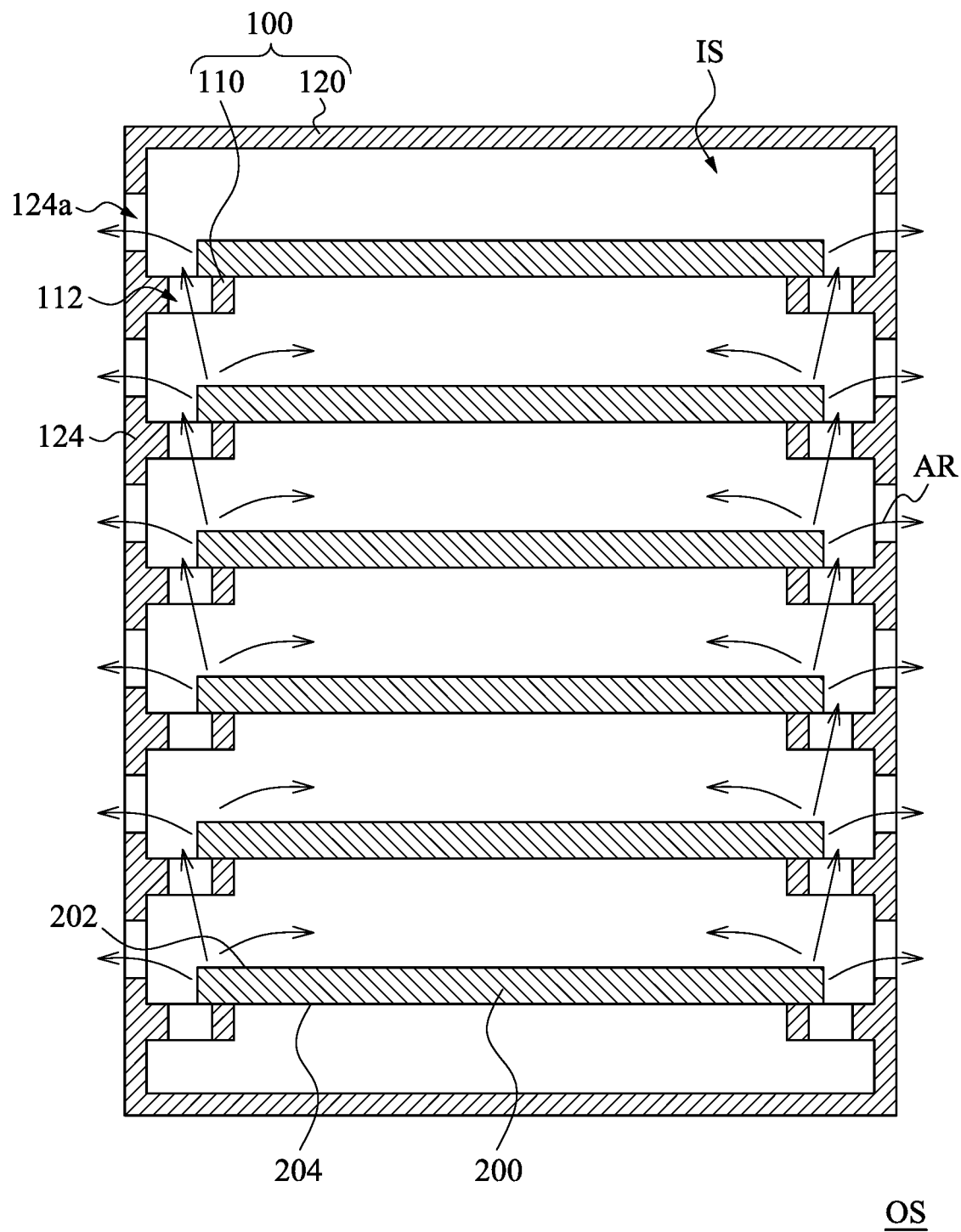
FIG. 4 is a schematical cross-sectional view of a wafer container when a wafer outgases according to some embodiments of the present disclosure.

FIG. 4 is a schematical cross-sectional view of a wafer container 100 when wafers 200 outgas according to some embodiments of the present disclosure. For better illustrated, arrows AR are depicted in the figure for showing directions of gas flows of an outgassing gas. As described previously, the wafers 200 may outgas due to the fabrication process of the features on the wafers 200. It is noted that, since the defects (such as aluminum fluoride oxide ($AlOxF_y$)) occur easily at the edges of the wafers 200, the outgassing gas at the edges of the wafers 200 is purposely discussed herein, and the discussion about the outgassing gas at the middle of the wafers 200 is omitted for simplifying the drawing.

Plural wafers 200 are shown in the wafer container 100. As shown in the figure, when the wafers 200 outgas, the outgassing gas generated at the edges of the wafers 200 is directed from the edges of wafers 200 through the openings 112 of the shelves 110 or the openings 124a of the sidewalls 124 to the inner space IS or the outer space OS diluted by the gas, flowing to the inner space IS and the outer space OS quickly. As a result, the outgassing gas may be diluted through the gas exchanging rapidly.

To be specific, in some embodiments of the present disclosure, the configuration of the opening 112 of the shelves 110 enhances the (vertical) flow rate of the gases confined by the shelves 110 and one of the sidewalls 124a. Therefore, the concentration of ionic fluorine species at the edges of the wafers 200 may be lowered, and thereby stopping the formation of the defects.

In some embodiments of the present disclosure, the configuration of the opening 124a of the sidewalls 124 enhances the (horizontal) flow rate of the gases confined by the shelves 110 and one of the sidewalls 124a. Furthermore, the gas in the inner space IS may exchange with the gas in the outer space OS through the opening 124a of the sidewalls 124. Therefore, the concentration of ionic fluorine species at the edges of the wafers may be lowered, and thereby stopping the formation of the defects.

In some embodiments of the present disclosure, the wafer container 100 is used for transporting and temporarily storing the wafer 200. In some embodiments, the wafer 200 outgases more ionic fluorine species when the wafer 200 is just placed in the wafer container 100. For lowering the initial concentration of the ionic fluorine species in the gas in the inner space IS, at least the inner space IS of the frame 120 may be purged with a nitrogen gas (or a noble gas) when the wafer 200 is (just) placed in the wafer container 100.

Through the purging process, the nitrogen gas fills the frame 120, and the gas existed originally in the inner space IS is forced to flow away from the inner space IS to the outer space OS. Through the purging process, the ionic fluorine species outgases from the wafer 200 initially may be removed with the flows of the nitrogen gas or the gas in the inner space IS. As a result, the concentration of ionic fluorine species may be lowered. Furthermore, in some embodiments, the aforementioned openings 112 of the shelves 110 and the openings 124a of the sidewall 124 may enhances the efficiency of the purging process by directing the gas in the frame 120 outwards rapidly.

Figure 5:
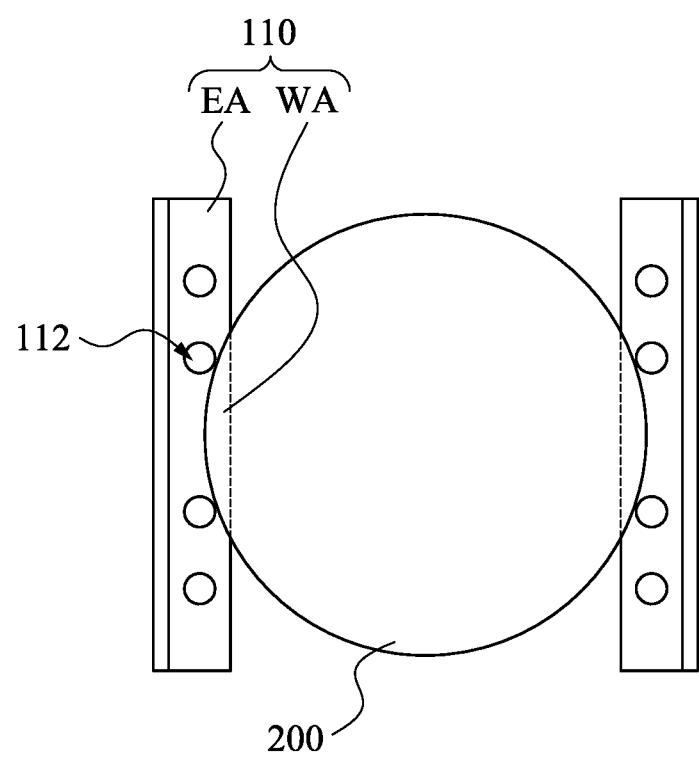
FIG. 5 is a top view of a pair of shelves of a wafer container according to some embodiments of the present disclosure.

FIG. 5 is a top view of a pair of shelves 110 of a wafer container 100 according to some embodiments of the present disclosure. The shelves 110 of the present embodiments are similar to the shelves 110 of FIG. 1B, and the difference between the present embodiments and the embodiments of FIG. 1B is that: the openings 112 of the shelves 110 in the present embodiments are not present in the wafer-area WA of the shelves 110. That is, the openings 112 of the shelves 110 are totally present in the edge area EA of the shelves 110. Other details are similar to that of the embodiments of FIG. 1B, and thereto not repeated herein.

In the present embodiments, through the configuration of the openings 112 of the shelves 110 or the openings 124a of the sidewall 124, when the wafer 200 is hold by the shelves 110, gas near the wafer exchanges rapidly. Therefore, the concentration of ionic fluorine species near the edges of the wafers may be kept lower, and thereby stopping the formation of the defects.

According to some embodiments of the present disclosure, a wafer container includes at least one shelf and a frame. The shelf is capable of holding at least one wafer, and has at least one opening therein. The opening is at least partially exposed by the wafer when the wafer is hold by the shelf. The frame carries the shelf and allows access to the shelf.

According to some embodiments of the present disclosure, a wafer container includes at least one shelf and a frame. The shelf is capable of holding at least one wafer. The frame has at least one sidewall, and the sidewall carries the shelf and allows access to the shelf, in which the sidewall of the frame has at least one opening therein.

According to some embodiments of the present disclosure, a method for holding a wafer includes: inserting at least one wafer into a frame carrying plural shelves, in which at least one of the frame and the shelves has an opening therein; and directing an outgassing gas from the wafer through the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer container, comprising:
   a frame comprising a first sidewall having a plurality of first openings therein and a second sidewall, and a front opening between the first and second sidewalls;
   a first shelf protruding from the first sidewall;
   a second shelf protruding from first sidewall and below the first shelf, configured to support a side of a wafer, and having a plurality of second openings therein,
   wherein the first and second shelves define a slot for the wafer, the second openings are positioned along a lengthwise direction thereof, a first one of the second openings is partially covered by the wafer when the wafer is held by the second shelf, the frame having a single elongated one of the first openings between the first and second shelves that are directly adjacent each other to allow for an increase flow of gases away from the wafer to reduce a formation of defects on the wafer, the single elongated one of the first openings of the first sidewall of the frame has a bottom side higher than the second shelf and a top side lower than the first shelf, a first plane that includes a bottom of the first shelf is offset from a second plane that includes an upper surface of the single elongated one of the first openings, and the second openings in the second shelf is configured to fluidly communicate with an outer space of the frame through the single elongated one of the first openings in the first sidewall past a periphery of the wafer; and
   a box accommodating the frame and spaced apart from the first and second sidewalls of the frame.

2. The wafer container of claim 1, further comprising a third shelf protruding from the second sidewall.

3. The wafer container of claim 1, wherein the single elongated one of the first openings of the frame has a longest dimension parallel to a longest dimension of the second shelf.

4. The wafer container of claim 1, wherein a third plane that includes a top surface of the second shelf is offset from a fourth plane that includes a bottommost position of the single elongated one of the first openings, and the single elongated one of the first openings is directly above the second shelf.

5. The wafer container of claim 1, wherein the first shelf has a plurality of third openings therein and positioned along a lengthwise direction thereof.

6. The wafer container of claim 5, wherein the first one of the second openings in the second shelf is configured to fluidly communicate with inner space of the frame through the third openings in the first shelf.

7. The wafer container of claim 6, wherein the third shelf has a plurality of third openings therein and positioned along a lengthwise direction thereof, such that one of the third openings is partially exposed by the wafer when the wafer is held by the second and third shelves.

8. The wafer container of claim 1, wherein the single elongated one of the first openings on the first sidewall extends past an outermost second one of the second openings on the second shelf along the lengthwise direction of the second shelf.

9. A wafer container, comprising:
   a first shelf;
   a second shelf directly below the first shelf, capable of holding a wafer, and having a plurality of first through holes therein and arranged along a lengthwise direction thereof, wherein a first one of the first through holes is partially covered by the wafer, when the wafer is held by the second shelf; and a frame having opposite first and second sidewalls, carrying the first and second shelves by the first sidewall, having a front opening between the first and second sidewalls, and allowing access to the first and second shelves, the first sidewall having a plurality of openings therein, wherein the frame has a single elongated one of the openings between the first and second shelves that are directly adjacent each other to allow for an increase flow of gases away from the wafer to reduce a formation of defects on the wafer, the single elongated one of the openings of the frame has a longest dimension in a direction perpendicular to a longest dimension of the first sidewall of the frame, and a first plane that includes a bottom of the first shelf is offset from a second plane that includes an upper surface of the single elongated one of the openings, and the first through holes in the second shelf is configured to fluidly communicate with an outer space of the frame through the single elongated one of the openings in the first sidewall past a periphery of the wafer.

10. The wafer container of claim 9, wherein the first and second shelves are vertically spaced apart to define a slot for the wafer.

11. The wafer container of claim 2, wherein a third plane that includes a top surface of the second shelf is offset from a fourth plane that includes a bottommost position of the single elongated one of the openings, and the single elongated one of the openings is directly above the second shelf.

12. The wafer container of claim 9, wherein the first shelf has a plurality of second through holes therein and positioned along a lengthwise direction thereof.

13. The wafer container of claim 12, wherein the one of the first through holes in the second shelf is configured to fluidly communicate with inner space of the frame through the second through holes in the first shelf.

14. The wafer container of claim 9, further comprising a third shelf protruding from the second sidewall and substantially horizontally aligned with the second shelf, wherein the third shelf has a plurality of second through holes therein and positioned along a lengthwise direction thereof, such that one of the second through holes is partially exposed by the wafer when the wafer is held by the second and third shelves.

15. The wafer container of claim 9, wherein the single elongated one of the openings on the first sidewall extends past an outermost second one of the first through holes on the second shelf along the lengthwise direction of the second shelf.

16. A wafer container, comprising:
a first shelf having a plurality of first openings therein and arranged along a lengthwise direction thereof;
a second shelf substantially horizontally aligned with the first shelf and having a plurality of second openings therein and arranged along a lengthwise direction thereof, wherein the first and second shelves are capable of holding a wafer, wherein a first one of the first openings is partially covered by the wafer, when the wafer is held by the first shelf;
a third shelf vertically below the first shelf and define a slot with the first shelf for the wafer;
a frame having a first sidewall carrying the first shelf, spaced apart from the second shelf, and having a plurality of third openings therein, a second sidewall carrying the second shelf and allowing access to the first and second shelves, wherein the frame has a single elongated one of the third openings between the first and second shelves that are directly adjacent each other to allow for an increase flow of gases away from the wafer to reduce a formation of defects on the wafer, the first and second shelves are configured to support opposite sides of a wafer respectively, and the single elongated one of the third openings of the first sidewall has a longest dimension parallel to a longest dimension of the first shelf, a first plane that includes a bottom of the first shelf is offset from a second plane that includes an upper surface of the single elongated one of the third openings, and the first openings in the first shelf is configured to fluidly communicate with an outer space of the frame through the single elongated one of the third openings in the first sidewall past a periphery of the wafer; and
a box accommodating the frame, wherein a door of the box leaves an air gap at an edge of the door when the door is assembled to the box.

17. The wafer container of claim 16, wherein the third shelf has a plurality of fourth openings therein, wherein the first openings of the first shelf are respectively substantially aligned with the fourth openings of the third shelf.

18. The wafer container of claim 16, wherein the first sidewall has a fourth opening therein, and the first shelf is between the single elongated one of the third openings and the fourth opening.

19. The wafer container of claim 16, wherein a third plane that includes a top surface of the third shelf is offset from a fourth plane that includes a bottommost position of the single elongated one of the third openings, and the single elongated one of the third openings is directly above the third shelf.

20. The wafer container of claim 16, wherein the single elongated one of the third openings on the first sidewall extends past an outermost second one of the first openings on the first shelf along the lengthwise direction of the first shelf.

* * * * *